(12) United States Patent
Diegmann

(10) Patent No.: US 11,946,951 B2
(45) Date of Patent: Apr. 2, 2024

(54) MEASUREMENT DEVICE AND METHOD

(71) Applicant: ROHDE & SCHWARZ GMBH & CO. KG, Munich (DE)

(72) Inventor: Philip Diegmann, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/675,230

(22) Filed: Feb. 18, 2022

(65) Prior Publication Data

US 2023/0266367 A1  Aug. 24, 2023

(51) Int. Cl.
    *G01R 13/02*     (2006.01)

(52) U.S. Cl.
    CPC ................... *G01R 13/0272* (2013.01)

(58) Field of Classification Search
    CPC .................................... G01R 13/0272
    USPC ........................................... 702/67
    See application file for complete search history.

(56) References Cited

U.S. PATENT DOCUMENTS

| 2008/0106448 A1 | 5/2008 | Harper | |
|---|---|---|---|
| 2018/0157383 A1* | 6/2018 | Barthel | G06F 3/04886 |
| 2022/0034941 A1* | 2/2022 | Bresser | G01R 1/073 |

FOREIGN PATENT DOCUMENTS

| CN | 102062798 B | * | 5/2015 | |
|---|---|---|---|---|
| CN | 107809248 A | * | 3/2018 | H03M 1/08 |

OTHER PUBLICATIONS

English translation for CN 107809248, Mar. 2018. (Year: 2018).*
English translation for CN 102062798, May 2015. (Year: 2015).*
Keysight Technologies, Infiniium UXR-Series Oscilloscopes Data Sheet (67 pages).

* cited by examiner

*Primary Examiner* — Michael P Nghiem
(74) *Attorney, Agent, or Firm* — Brooks Kushman P.C.

(57) ABSTRACT

The present disclosure provides a measurement device comprising at least two measurement signal inputs, and at least two multi-channel analog-to-digital converters, each multi-channel analog-to-digital converter comprising two ADC signal inputs and being selectively operable in an interleaved operating mode or a non-interleaved operating mode, wherein each one of the measurement signal inputs of consecutive pairs of signal inputs is coupled to a different one of the multi-channel analog-to-digital converters. The present disclosure further provides a respective method.

21 Claims, 8 Drawing Sheets

MEASUREMENT DEVICE AND METHOD

TECHNICAL FIELD

The disclosure relates to a measurement device and a respective method.

BACKGROUND

Although applicable to any measurement instrument, the present disclosure will mainly be described in conjunction with oscilloscopes.

Measurement devices are used in many applications today, like for example during the development of new electronic devices or for identifying errors or faults in existing devices.

With increasing bandwidth of the signals that are to be measured, the bandwidth of the measurement devices should increase accordingly.

SUMMARY

The above stated problem is solved by the features of the independent claims. It is understood, that independent claims of a claim category may be formed in analogy to the dependent claims of another claim category.

Accordingly, it is provided:

A measurement device comprising at least two measurement signal inputs, and at least two multi-channel analog-to-digital converters, each multi-channel analog-to-digital converter comprising two ADC signal inputs and being selectively operable in an interleaved operating mode or a non-interleaved operating mode, wherein each one of the measurement signal inputs of consecutive pairs of signal inputs is coupled to a different one of the multi-channel analog-to-digital converters.

Further, it is provided:

A method for measuring at least two signals, the method comprising receiving the signals with at least two measurement signal inputs, and providing the received signals to at least two multi-channel analog-to-digital converters, each multi-channel analog-to-digital converter comprising two ADC signal inputs and being selectively operable in an interleaved operating mode or a non-interleaved operating mode, wherein each one of signals that are received at the measurement signal inputs of one of consecutive pairs of signal inputs is coupled or provided to a different one of the multi-channel analog-to-digital converters.

The present invention is based on the finding, that users tend to use the measurement signal inputs of measurement devices in a sequential or consecutive manner. That means that the user will usually use neighboring measurement signal inputs from left to right or right to left to measure multiple signals at the same time.

In modern measurement devices, especially in (digital) oscilloscopes, the signals to be measured may be converted from analog to digital signals for further processing. In order to save space, and building elements, and in order to provide a higher bandwidth for the measurement of single signals, such measurement devices may use multi-channel analog-to-digital converters that comprise two ADC signal inputs and may either operate on a single signal in an high-speed interleaved operating mode or on two signals at the same time in a slower or lower-bandwidth non-interleaved operating mode.

In the interleaved operating mode, such multi-channel analog-to-digital converters use two channels to convert a single signal from analog to digital. In the non-interleaved mode, in contrast, the multi-channel analog-to-digital converters will use a dedicated channel for each one of the two signals.

The present disclosure provides a measurement device that allows using as many of the measurement signal inputs of the measurement device in the high-speed or interleaved operation mode of the respective multi-channel analog-to-digital converters as possible, even if a user sequentially couples measurement probes to the measurement signal inputs.

To this end, the present disclosure provides a measurement device with a least two measurement signal inputs that may each receive a signal to be measured. However, instead of coupling two consecutive measurement signal inputs to two different ADC signal inputs of the same multi-channel analog-to-digital converter, the measurement signal inputs of consecutive pairs of signal inputs are each coupled to a different one of the multi-channel analog-to-digital converters. The term "pairs" in this regard refers to the two of the measurement signal inputs that comprise connectors that are arranged on the measurement device next to each other e.g., on a front plate of the measurement device.

Therefore, even if a user connects two consecutive measurement signal inputs of such a pair to a device under test, the two signals will not be converted from analog to digital by the same multi-channel analog-to-digital converter. This means that up to half of the measurement signal inputs of a measurement device may be used in a measurement application and may measure signals in the high-speed or high-bandwidth mode of the respective multi-channel analog-to-digital converter.

As soon as a further signal is to be measured, one of the multi-channel analog-to-digital converters will receive two signals and, therefore, will be switched into the non-interleaved operation mode.

The measurement device of the present disclosure may for example be provided as an oscilloscope, but is not limited to oscilloscopes.

The measurement device may for example comprise a housing that accommodates the measurement signal inputs on the front together with user input elements and a display. Of course, such a measurement device may also comprise further elements, like signal acquisition circuitry, processors and controllers, memory elements, and communication interfaces.

As alternative, the measurement device may also be provided as a signal acquisition interface device that may be coupled to a computing device or computer for user interaction and displaying of the signals. Such a signal acquisition interface device may for example comprise a signal acquisition circuitry and analog to digital converters together with a communication interface, like a USB interface or a network interface, that couples the signal acquisition interface device to a computer or computing device. The acquired signals in such a measurement device may be transmitted via the communication interface after conversion from analog to digital signals.

Further embodiments of the present disclosure are subject of the further dependent claims and of the following description, referring to the drawings.

In an embodiment, the first measurement signal inputs and the second measurement signal inputs of consecutive pairs may be both connected to the first ADC signal inputs of different multi-channel analog-to-digital converters until all first ADC signal inputs of different multi-channel analog-to-digital converters are occupied.

The measurement signal inputs are coupled to the ADC signal inputs in consecutive order independently of the single measurement signal input being a first or second ADC signal input of a respective pair. That means that for example, measurement signal input 1 of the measurement device is coupled to the first ADC signal input of a first multi-channel analog-to-digital converter, and measurement signal input 2 of the measurement device is coupled to the first ADC signal input of a second multi-channel analog-to-digital converter, and so on, until all first ADC signal inputs of all multi-channel analog-to-digital converters are occupied.

This arrangement ensures that the number of consecutive measurement signal inputs that may be concurrently used with the respective multi-channel analog-to-digital converters operating in the interleaved operation mode may be maximized.

In a further embodiment, the measurement device may comprise four measurement signal inputs forming two pairs of measurement signal inputs. The first measurement signal input of the first pair may be coupled to the first ADC signal input of the first multi-channel analog-to-digital converter, and the second measurement signal input of the first pair may be coupled to the first ADC signal input of the second multi-channel analog-to-digital converter. The first measurement signal input of the second pair may be coupled to the second ADC signal input of the first multi-channel analog-to-digital converter, and the second measurement signal input of the second pair may be coupled to the second ADC signal input of the second multi-channel analog-to-digital converter.

In measurement devices with four measurement signal inputs this arrangement allows using either measurement signal input 1 and 2, or measurement signal input 3 and 4 for acquiring signals with the multi-channel analog-to-digital converters operating in the high-bandwidth interleaved operating mode.

Therefore, if a user follows his customary practice of connecting the measurement signal inputs sequentially to the device under test, up to two signals of four possible signals may be measured with high-bandwidth.

Would two consecutive measurement signal inputs be connected to the first and second ADC signal inputs of a single multi-channel analog-to-digital converter, the first two signals would be provided to the same multi-channel analog-to-digital converter. With only two signals to be measured, this multi-channel analog-to-digital converter would already be operated in the non-interleaved operating mode.

In another embodiment, the measurement device may comprise eight measurement signal inputs forming four pairs of measurement signal inputs, and may comprise four multi-channel analog-to-digital converters. The first measurement signal input of the first pair may be coupled to the first ADC signal input of the first multi-channel analog-to-digital converter, and the second measurement signal input of the first pair may be coupled to the first ADC signal input of the second multi-channel analog-to-digital converter. The first measurement signal input of the second pair may be coupled to the first ADC signal input of the third multi-channel analog-to-digital converter, and the second measurement signal input of the second pair may be coupled to the first ADC signal input of the fourth multi-channel analog-to-digital converter. The first measurement signal input of the third pair may be coupled to the second ADC signal input of the first multi-channel analog-to-digital converter, and the second measurement signal input of the third pair may be coupled to the second ADC signal input of the second multi-channel analog-to-digital converter. The first measurement signal input of the fourth pair may be coupled to the second ADC signal input of the third multi-channel analog-to-digital converter, and the second measurement signal input of the fourth pair may be coupled to the second ADC signal input of the fourth multi-channel analog-to-digital converter.

In measurement devices with eight measurement signal inputs this arrangement allows using either measurement signal inputs 1 to 4, or measurement signal inputs 5 to eight for acquiring signals with the multi-channel analog-to-digital converters operating in the high-bandwidth interleaved operating mode.

Therefore, if a user follows his customary practice of connecting the measurement signal inputs sequentially to the device under test, up to four signals of eight possible signals may be measured with high-bandwidth.

Would in each case two consecutive measurement signal inputs be connected to the first and second ADC signal inputs of the respective multi-channel analog-to-digital converter, the first two signals would be provided to the same multi-channel analog-to-digital converter, and so on. With only two signals to be measured, this multi-channel analog-to-digital converter would already be operated in the non-interleaved operating mode.

In yet another embodiment, the measurement device may comprise a front plate that mechanically accommodates the at least two measurement signal inputs. The front plate may comprise a label for each one of the at least two measurement signal inputs that designates the respective one of the at least two measurement signal inputs.

As indicated above, the measurement device may comprise a housing that comprises the measurement signal inputs, and possibly a display and user inputs on the front. The front may be provided as a front plate that accommodates the respective elements.

The front plate may also provide a label for each one of the measurement signal inputs. Such a label may identify the respective measurement signal input, and for example allow the user to select or configure specific functions for a specific measurement signal input by selecting the respective label on the display via the user interface and configuring the measurement signal input accordingly via the user interface.

In an embodiment, the labels are all different or unique. Of course, the label could simply read "Inputs" or the like. However, labels that are unique or different for every single measurement signal input allow to specifically designate every single measurement signal input.

In a further embodiment, the labels may comprise a sequential indication, like a sequential numbering or an alphabetical reference.

Possible indications on the label may for example comprise consecutive numbers for consecutive or neighboring measurement signal inputs, like for example 1, 2, 3, 4, . . . or 01, 02, 03, 04. Alphabetical references may for example comprise single letters, like for example A, B, C, D, . . . , or letter combinations, like for example AA, AB, AC, AD or AA, BB, CC, DD.

A combination of numbers and letters is also possible. Such labels may display for example A1, A2, A3, A4 or A1, B2, C3, D4.

It is understood, that the above examples are only provided to indicate examples of possible labels and that the labels according to the present disclosure are not limited to the shown examples. The labels instead are intended to encompass any of at least one of letters and alphanumerical characters.

In another embodiment, each one of the multi-channel analog-to-digital converters may be provided as a dedicated converter element.

The single multi-channel analog-to-digital converters may each be provided as a separate element, for example in the data acquisition circuitry of the respective measurement device. Each of these multi-channel analog-to-digital converters may be provided in a dedicated housing. Consequently, each one of the multi-channel analog-to-digital converters is a fully operational analog-to-digital converter on its own that may be operated in the interleaved operating mode or the non-interleaved operating mode.

The multi-channel analog-to-digital converters may for example be provided as respective semiconductor devices.

In another embodiment, a plurality of multi-channel analog-to-digital converters may be integrated in a single integrated circuit device. In such an embodiment, the single multi-channel analog-to-digital converters may be provided as dedicated elements on a common substrate or as single substrates in a common housing.

In an embodiment, each one of the multi-channel analog-to-digital converters may comprise two analog-to-digital converter elements.

The multi-channel analog-to-digital converters may operate in the interleaved operating mode by converting the respective signal into digital values with each of the two analog-to-digital converter elements in an alternating fashion. That means that for example one of the analog-to-digital converter elements acquires the signal at a first point in time, wherein the other analog-to-digital converter element acquires the signal in a second point in time. The first analog-to-digital converter element may process the acquired signal at that second point in time and provide a digital output value. At a third point in time, the first analog-to-digital converter element may acquire a next signal value, while the second analog-to-digital converter element may process the acquired signal at that third point in time and provide a digital output value, and so on.

Using a multi-channel analog-to-digital converter with two analog-to-digital converter elements therefore increases the sampling rate of the multi-channel analog-to-digital converter by a factor of two.

In embodiments, the multi-channel analog-to-digital converter may comprise more than two analog-to-digital converter elements.

For example, a multi-channel analog-to-digital converter may comprise three analog-to-digital converter elements and three ADC signal inputs. Therefore, either up to three signals may be provided to the multi-channel analog-to-digital converter in a non-interleaved operating mode or a signal may be acquired with three times the sample rate in the interleaved operating mode.

In a further example, a multi-channel analog-to-digital converter may comprise a number of analog-to-digital converter elements that is a multiple of two and comprise two ADC signal inputs. In such an example, the analog-to-digital converter elements may be grouped into two groups, one group for each ADC signal input. and each group may operate in an interleaved operating mode when a signal is provided.

In a further embodiment, each one of the multi-channel analog-to-digital converters may comprise a multiplexer coupled on the input-side to the two ADC signal inputs and on the output-side to the two analog-to-digital converter elements of the respective multi-channel analog-to-digital converter.

The multiplexer may be a controllable multiplexer and may serve as the main element when switching the multi-channel analog-to-digital converters from the non-interleaved operating mode to the interleaved operating mode and back.

The multiplexer is coupled to both ADC signal inputs of the respective multi-channel analog-to-digital converter. When the multi-channel analog-to-digital converters is provided with only one signal on only one ADC signal input, the multiplexer may provide that signal to both analog-to-digital converter elements. In case that the multi-channel analog-to-digital converter receives two signals, the multiplexer may provide each of the signal to one of the analog-to-digital converter elements. Of course, instead of a single multiplexer multiple multiplexers may be provided. For example, one multiplexer may be provided for every ADC signal input.

In another embodiment, the measurement device may comprise an indicator that indicates which of the measurement signal inputs is coupled to one of the multi-channel analog-to-digital converters that only receives a signal on one of the ADC signal inputs.

The indicator may have any form that may be perceived by a user. In an example, the indicator may comprise a single light-based indicator, like a LED at the respective measurement signal input. For example, a turned-on green LED next to a measurement signal input may indicate that the respective input may acquire a signal with the higher sampling rate, i.e., with the multi-channel analog-to-digital converter in the interleaved operating mode. If the green LED is turned off, this may indicate that the respective measurement signal input may only acquire a signal with low sampling rate because the respective multi-channel analog-to-digital converter already receives another signal and operates in the non-interleaved operation mode.

In another example, the indictor may be provided as a two-color indicator, a green light for example indicating that high sample rate data acquisition is possible with the respective measurement signal input and an orange or red light indicating that low sample rate data acquisition is possible with the respective measurement signal input. Of course other light colors may also be used.

Instead of colored lights the indicator may also comprise symbols that may be illuminated accordingly. Such symbols may be shown next to the measurement signal input on the front plate. Such symbols may also be shown on a display of the measurement device in graphical form.

In an embodiment, the measurement device may be provided as an oscilloscope, especially a digital oscilloscope. Oscilloscopes are measurement devices that are usually used to acquire one or more electrical signals and to display waveforms according to the acquired signals on a display to a user.

Especially, oscilloscopes are available with a plurality of measurement signal inputs. If the measurement signal inputs of an oscilloscope are connected to the multi-channel analog-to-digital converters as explained in this disclosure, the user will be provided with a maximum amount of signals that he may measure with maximum sample rate or bandwidth, without the user being required to perform any counter-intuitive connections between the measurement signal inputs and a respective device under test.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
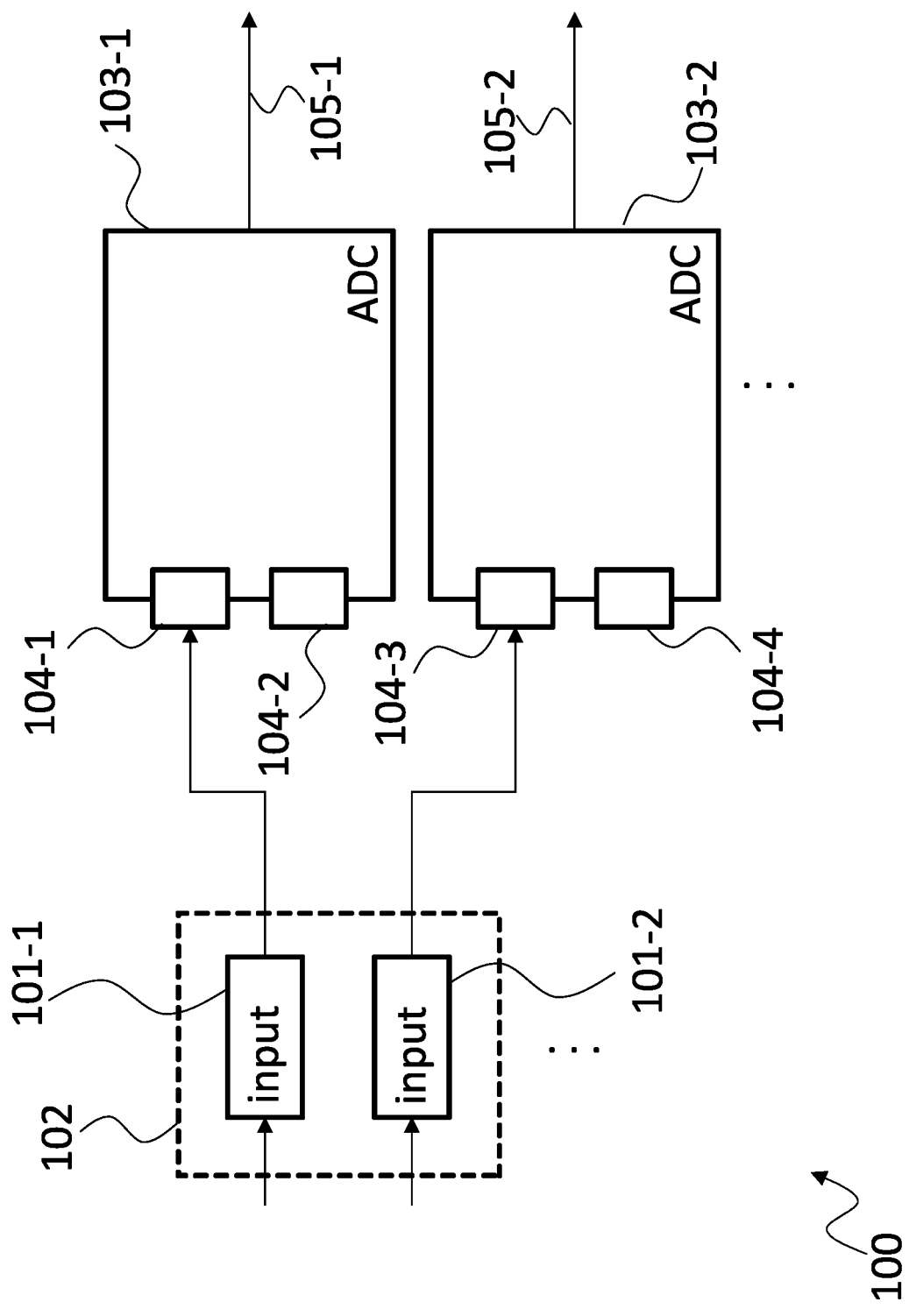
FIG. 1 shows a block diagram of an embodiment of a measurement device according to the present disclosure.

FIG. 1 shows a block diagram of a measurement device 100. The measurement device 100 comprises two measurement signal inputs 101-1, 101-2 that together form a pair 102. The measurement device 100 further comprises two multi-channel analog-to-digital converters 103-1, 103-2. Wherein each multi-channel analog-to-digital converter 103-1, 103-2 comprises two ADC signal inputs 104-1, 104-2; 104-3, 104-4.

Although only one pair 102 of measurement signal inputs 101-1, 101-2 is shown, three dots indicate that further measurement signal inputs are possible. Usually, the number of measurement signal inputs will be a multiple of two or an even number forming further pairs. In examples an uneven number of measurement signal inputs is also possible, leaving the last single measurement signal input that does not form a pair with another measurement signal input.

The first measurement signal input 101-1 is coupled to the first ADC signal input 104-1 of the first multi-channel analog-to-digital converter 103-1, and the second measurement signal input 101-2 is coupled to the first ADC signal input 104-3 of the second multi-channel analog-to-digital converter 103-2. Generally, each one of the measurement signal inputs 101-1, 101-2 of a pair 102 is sequentially coupled to a different one of the multi-channel analog-to-digital converters 103-1, 103-2, until all multi-channel analog-to-digital converters 103-1, 103-2 are provided with one signal. Further measurement signal inputs are then sequentially coupled to the second ADC signal inputs of the multi-channel analog-to-digital converters 103-1, 103-2.

This arrangement ensures that the signals of consecutive ones of the measurement signal inputs 101-1, 101-2 are provided to different ones of the multi-channel analog-to-digital converters 103-1, 103-2 if the user intuitively couples the measurement signal inputs 101-1, 101-2 sequentially to a device under test. This applies at least as long as the number of concurrently measured signals is lower as or equal to the number of multi-channel analog-to-digital converters 103-1, 103-2 in the measurement device 100. Consecutive in this regard refers to the measurement signal inputs 101-1, 101-2 being arranged on the measurement device 100, especially on a user facing part of the measurement device 100, in a sequential arrangement.

The multi-channel analog-to-digital converters 103-1, 103-2 may be selectively operable in an interleaved operating mode or a non-interleaved operating mode. While only a single signal is provided to one of the multi-channel analog-to-digital converters 103-1, 103-2, this multi-channel analog-to-digital converter 103-1, 103-2 will usually operate in the interleaved operation mode. As soon as a second signal is provided to one of the multi-channel analog-to-digital converters 103-1, 103-2, this multi-channel analog-to-digital converter 103-1, 103-2 will usually operate in the non-interleaved mode.

Although not explicitly shown, it is understood that a control circuitry may also be provided that controls the multi-channel analog-to-digital converters 103-1, 103-2 to operate in either the interleaved operating mode or the non-interleaved operating mode. Further, it is understood, that the measurement signal inputs 101-1, 101-2 may comprise data acquisition circuitry, like for example filters, attenuators, amplifiers and the like. The measurement device 100 may also comprise additional circuitry, like for example power supply circuitry, and further signal processing circuitry that may be coupled to the multi-channel analog-to-digital converters 103-1, 103-2 and process the digital signals 105-1, 105-2 provided by the multi-channel analog-to-digital converters 103-1, 103-2.

Figure 2:
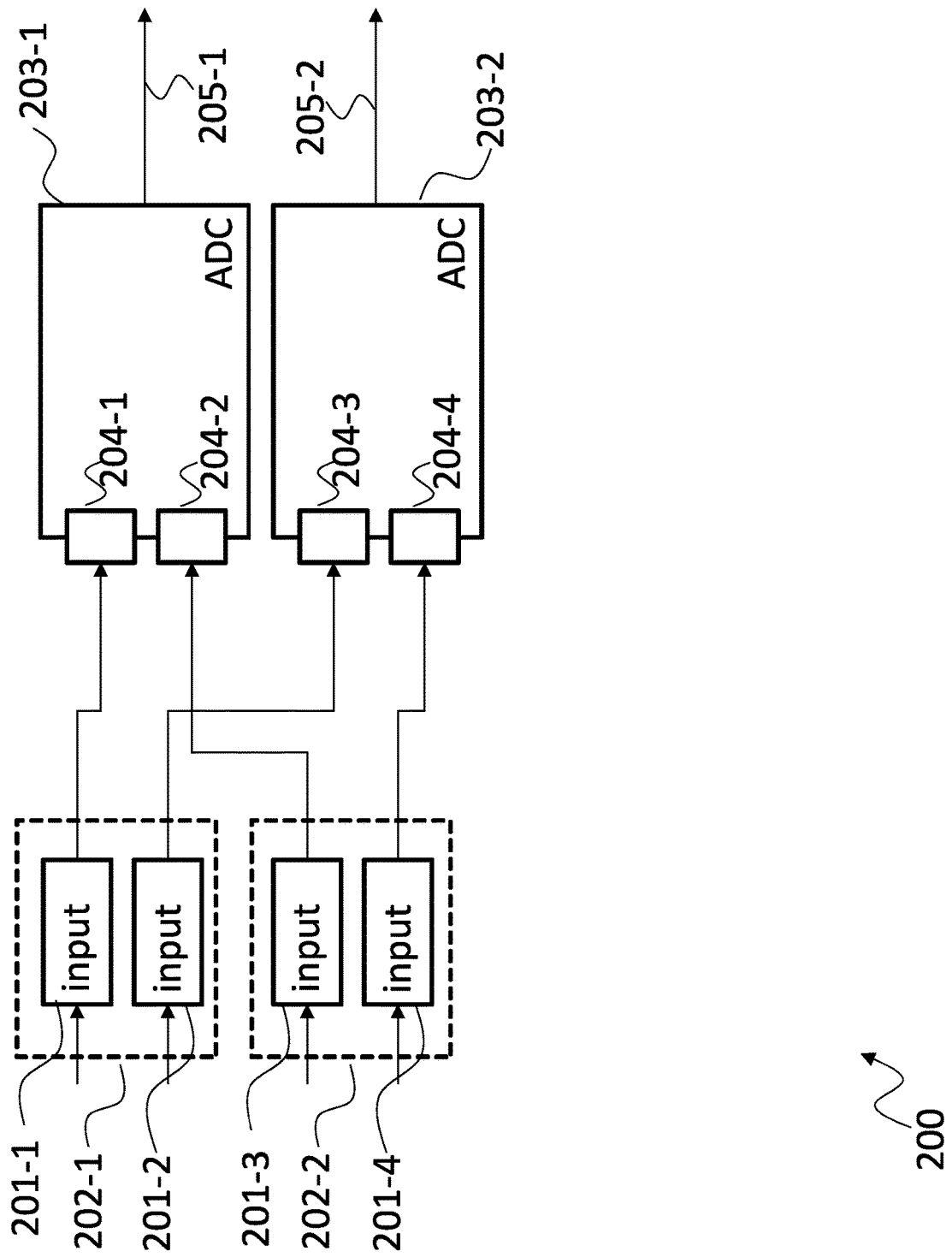
FIG. 2 shows a block diagram of another embodiment of a measurement device according to the present disclosure.

FIG. 2 shows a block diagram of another measurement device 200. The measurement device 200 is based on the measurement device 100. The measurement device 200 comprises four measurement signal inputs 201-1, 201-2, 201-3, 201-4 that form two pairs 202-1, 202-2. In addition, the measurement device 200 comprises two multi-channel analog-to-digital converters 203-1, 203-2, that each comprise two ADC signal inputs 204-1, 204-2, 204-3, 204-4. The explanations regarding the measurement device 100 therefore apply mutatis mutandis to the measurement device 200.

The principle of connecting the single measurement signal inputs 201-1, 201-2, 201-3, 201-4 to the ADC signal inputs 204-1, 204-2, 204-3, 204-4 according to the present disclosure is exemplified in the measurement device 200 for four measurement signal inputs 201-1, 201-2, 201-3, 201-4.

The first one of the measurement signal inputs 201-1, 201-2, 201-3, 201-4 is coupled to the first one of the ADC signal inputs 204-1, 204-2, 204-3, 204-4 of the first multi-channel analog-to-digital converter 203-1. The second one of the measurement signal inputs 201-1, 201-2, 201-3, 201-4 is coupled to the first one of the ADC signal inputs 204-1, 204-2, 204-3, 204-4 of the second multi-channel analog-to-digital converter 203-2. The third one of the measurement signal inputs 201-1, 201-2, 201-3, 201-4 is coupled to the second one of the ADC signal inputs 204-1, 204-2, 204-3, 204-4 of the first multi-channel analog-to-digital converter 203-1. The fourth one of the measurement signal inputs 201-1, 201-2, 201-3, 201-4 is coupled to the second one of the ADC signal inputs 204-1, 204-2, 204-3, 204-4 of the second multi-channel analog-to-digital converter 203-2.

Therefore, if a user starts using the measurement signal inputs 201-1, 201-2, 201-3, 201-4 from first to last or last to first, the first two signals will always be measured by different ones of the multi-channel analog-to-digital converters 203-1, 203-2. The multi-channel analog-to-digital converters 203-1, 203-2 may therefore operate in the interleaved mode.

Figure 3:
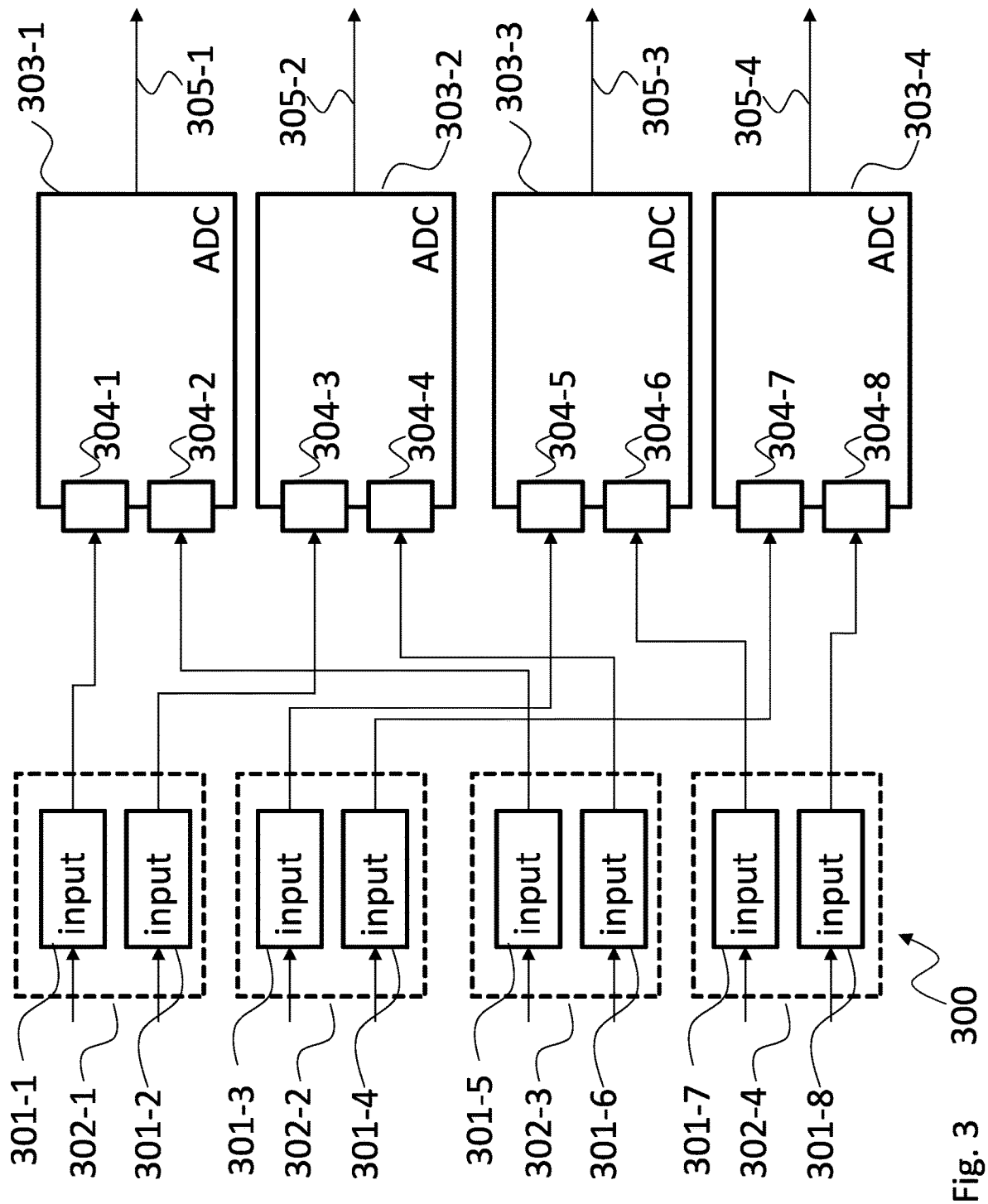
FIG. 3 shows a block diagram of another embodiment of a measurement device according to the present disclosure.

FIG. 3 shows a block diagram of another measurement device 300. The measurement device 300 comprises eight measurement signal inputs 301-1, 301-2, 301-3, 301-4, 301-5, 301-6, 301-7, 301-8 that form four pairs 302-1, 302-2, 302-3, 302-4. In addition, the measurement device 300 comprises four multi-channel analog-to-digital converters 303-1, 303-2, 303-3, 303-4, that each comprise two ADC signal inputs 304-1, 304-2, 304-3, 304-4, 304-5, 304-6, 304-7, 304-8. The explanations regarding the measurement device 200 therefore apply mutatis mutandis to the measurement device 300.

The first one of the measurement signal inputs 301-1, 301-2, 301-3, 301-4, 301-5, 301-6, 301-7, 301-8 is coupled to the first one of the ADC signal inputs 304-1, 304-2, 304-3, 304-4, 304-5, 304-6, 304-7, 304-8 of the first multi-channel analog-to-digital converter 303-1. The second one of the measurement signal inputs 301-1, 301-2, 301-3, 301-4, 301-5, 301-6, 301-7, 301-8 is coupled to the first one of the ADC signal inputs 304-1, 304-2, 304-3, 304-4, 304-5, 304-6, 304-7, 304-8 of the second multi-channel analog-to-digital converter 303-2. The third one of the measurement signal inputs 301-1, 301-2, 301-3, 301-4, 301-5, 301-6, 301-7, 301-8 is coupled to the first one of the ADC signal inputs 304-1, 304-2, 304-3, 304-4, 304-5, 304-6, 304-7, 304-8 of the third multi-channel analog-to-digital converter 303-3. The fourth one of the measurement signal inputs 301-1, 301-2, 301-3, 301-4, 301-5, 301-6, 301-7, 301-8 is coupled to the first one of the ADC signal inputs 304-1, 304-2, 304-3, 304-4, 304-5, 304-6, 304-7, 304-8 of the fourth multi-channel analog-to-digital converter 303-2. The fifth one of the measurement signal inputs 301-1, 301-2, 301-3, 301-4, 301-5, 301-6, 301-7, 301-8 is coupled to the second one of the ADC signal inputs 304-1, 304-2, 304-3, 304-4, 304-5, 304-6, 304-7, 304-8 of the first multi-channel analog-to-digital converter 303-1. The sixth one of the measurement signal inputs 301-1, 301-2, 301-3, 301-4, 301-5, 301-6, 301-7, 301-8 is coupled to the second one of the ADC signal inputs 304-1, 304-2, 304-3, 304-4, 304-5, 304-6, 304-7, 304-8 of the second multi-channel analog-to-digital converter 303-2. The seventh one of the measurement signal inputs 301-1, 301-2, 301-3, 301-4, 301-5, 301-6, 301-7, 301-8 is coupled to the second one of the ADC signal inputs 304-1, 304-2, 304-3, 304-4, 304-5, 304-6, 304-7, 304-8 of the third multi-channel analog-to-digital converter 303-3. The eight one of the measurement signal inputs 301-1, 301-2, 301-3, 301-4, 301-5, 301-6, 301-7, 301-8 is coupled to the second one of the ADC signal inputs 304-1, 304-2, 304-3, 304-4, 304-5, 304-6, 304-7, 304-8 of the fourth multi-channel analog-to-digital converter 303-4.

Generally, each one of the measurement signal inputs 301-1, 301-2, 301-3, 301-4, 301-5, 301-6, 301-7, 301-8 of a pair 302-1, 302-2, 302-3, 302-4 is sequentially coupled to a different one of the multi-channel analog-to-digital converters 303-1, 303-2, 303-3, 303-4, until all multi-channel analog-to-digital converters 303-1, 303-2, 303-3, 303-4 are provided with one signal. Further measurement signal inputs are then sequentially coupled to the second ADC signal inputs of the multi-channel analog-to-digital converters 303-1, 303-2, 303-3, 303-4.

This arrangement ensures that the signals of consecutive ones of the measurement signal inputs 301-1, 301-2, 301-3, 301-4, 301-5, 301-6, 301-7, 301-8 are provided to different ones of the multi-channel analog-to-digital converters 303-1, 303-2, 303-3, 303-4 if the user intuitively couples the measurement signal inputs 301-1, 301-2, 301-3, 301-4, 301-5, 301-6, 301-7, 301-8 sequentially to a device under test. This applies at least as long as the number of concurrently measured signals is lower as or equal to the number of multi-channel analog-to-digital converters 303-1, 303-2, 303-3, 303-4 in the measurement device 300.

Figure 4:
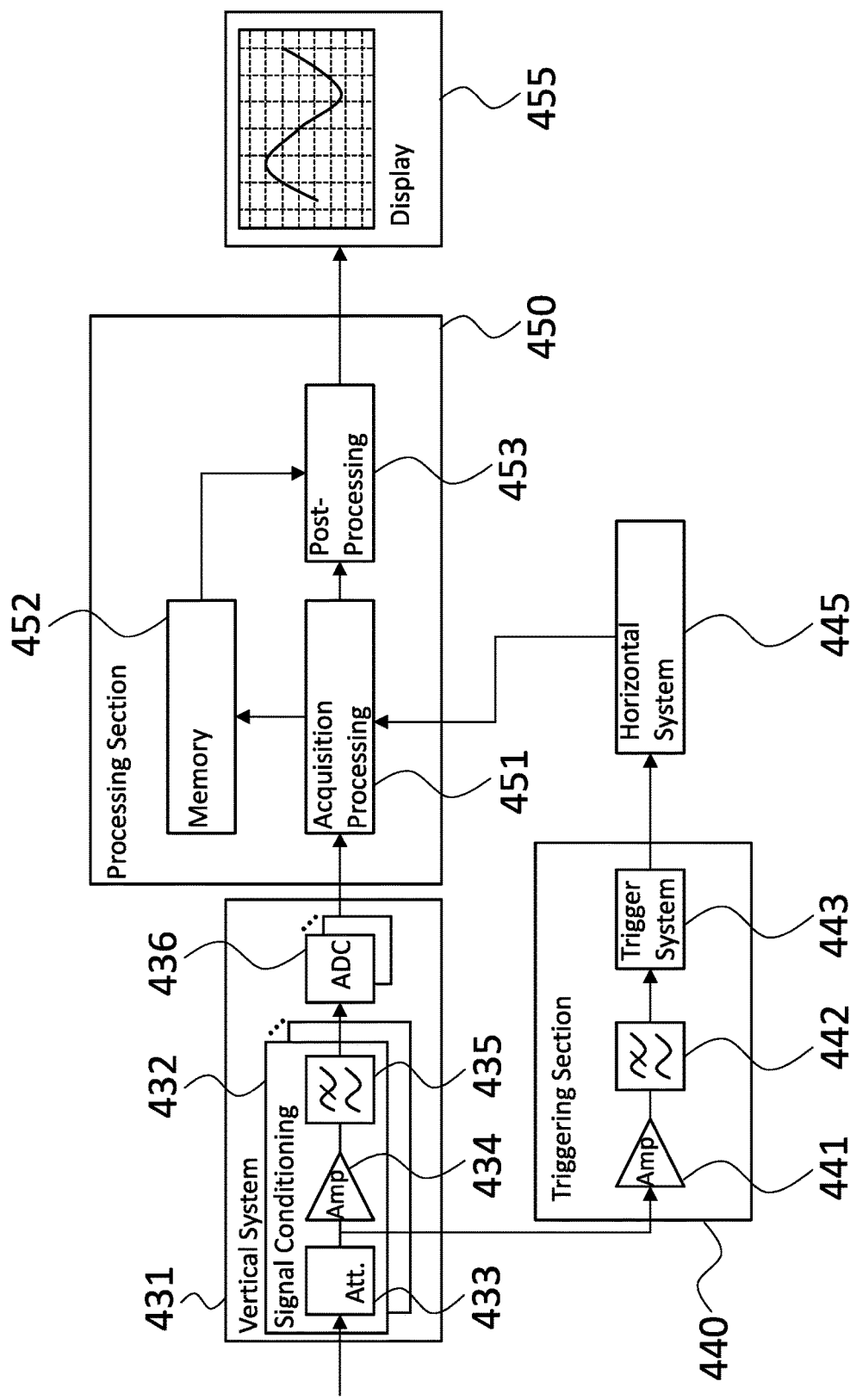
FIG. 4 shows a block diagram of an embodiment of an oscilloscope as a measurement device according to the present disclosure.

FIG. 4 shows a block diagram of an oscilloscope 430 that may be an implementation of a measurement device according to the present invention. The oscilloscope 430 is implemented as a digital oscilloscope. However, the present invention may also be implemented with any other type of oscilloscope.

The oscilloscope 430 exemplarily comprises five general sections, the vertical system 431, the triggering section 440, the horizontal system 445, the processing section 450 and the display 455. It is understood, that the partitioning into five general sections is a logical partitioning and does not limit the placement and implementation of any of the elements of the oscilloscope 430 in any way.

The vertical system 431 mainly serves for attenuating or amplifying a signal to be acquired. The signal may for example be modified to fit the signal in the available space on the display 455 or to comprise a vertical size as configured by a user.

To this end, the vertical system 431 comprises a signal conditioning section 432 with an attenuator 433 that is coupled to an amplifier 434. The amplifier 434 is coupled to a filter 435, which in the shown example is provided as a low pass filter. The vertical system 431 also comprises an analog-to-digital converter 436 that receives the output from the filter 435 and converts the received analog signal into a digital signal.

In FIG. 4 the vertical system 431 is shown as comprising a plurality of signal conditioning sections 432, which are indicated by three dots. It is understood, that in embodiments, a respective signal conditioning section may be provided for each one of the measurement signal inputs. In addition, multiple analog-to-digital converters 436 are indicated by three dots. It is understood, that as many analog-to-digital converters 436 may be provided as multi-channel analog-to-digital converters are required in the respective oscilloscope 430 according to the present disclosure.

The attenuator 433 and the amplifier 434 serve to scale the waveform of the signal and to condition the amplitude of the signal to be acquired to match the operation range of the analog-to-digital converter 436. The filter 435 serves to filter out unwanted high frequency components of the signal to be acquired.

The triggering section 440 comprises an amplifier 441 that is coupled to a filter 442, which in this embodiment is implemented as a low pass filter. The filter 442 is coupled to a trigger system 443.

The triggering section 440 serves to capture predefined signal events and allows the horizontal system 445 to e.g., display a stable view of a repeating waveform, or to simply display waveform sections that comprise the respective signal event. It is understood, that the predefined signal event may be configured by a user via a user input of the oscilloscope 430.

Possible predefined signal events may for example include, but are not limited to, when the signal crosses a predefined trigger threshold in a predefined direction i.e., with a rising or falling slope. Such a trigger condition is also called an edge trigger. Another trigger condition is called "glitch triggering" and triggers, when a pulse occurs in the signal to be acquired that has a width that is greater than or less than a predefined amount of time.

The triggering section 440 operates on the signal as provided by the attenuator 433, which is fed into the amplifier 441. The amplifier 441 serves to condition the input signal to the operating range of the trigger system 443. It is understood, that a common amplifier may also be used instead of the dedicated amplifiers 434 and 441.

In order to allow an exact matching of the trigger event and the waveform that is shown on the display 455, a common time base may be provided for the analog-to-digital converter 436 and the trigger system 443.

It is understood, that although not explicitly shown, the trigger system 443 may comprise at least one of <configurable voltage comparators for setting the trigger threshold voltage, fixed voltage sources for setting the required slope, respective logic gates like e.g., a XOR gate, and FlipFlops to generate the triggering signal.

The triggering section 440 is exemplarily provided as an analog trigger section. It is understood, that the oscilloscope 430 may also be provided with a digital triggering section. Such a digital triggering section will not operate on the analog signal as provided by the attenuator 433 but will operate on the digital signal as provided by the analog-to-digital converter 436.

A digital triggering section may comprise a processing element, like a processor, a DSP, a CPLD or an FPGA to implement digital algorithms that detect a valid trigger event.

The horizontal system 445 is coupled to the output of the trigger system 443 and mainly serves to position and scale the signal to be acquired horizontally on the display 455.

The oscilloscope 430 further comprises a processing section 450 that implements digital signal processing and data storage for the oscilloscope 430. The processing section 450 comprises an acquisition processing element 451 that is couple to the output of the analog-to-digital converter 436 and the output of the horizontal system 445 as well as to a memory 452 and a post processing element 453.

The acquisition processing element 451 manages the acquisition of digital data from the analog-to-digital converter 436 and the storage of the data in the memory 452. The acquisition processing element 451 may for example comprise a processing element with a digital interface to the analog-to-digital converter 436 and a digital interface to the memory 452. The processing element may for example comprise a microcontroller, a DSP, a CPLD or an FPGA with respective interfaces. In a microcontroller or DSP the functionality of the acquisition processing element 451 may be implemented as computer readable instructions that are executed by a CPU. In a CPLD or FPGA the functionality of the acquisition processing element 451 may be configured in to the CPLD or FPGA.

The post processing element 453 may be controlled by the acquisition processing element 451 and may access the memory 452 to retrieve data that is to be displayed on the display 455. The post processing element 453 may condition the data stored in the memory 452 such that the display 455 may show the data e.g., as waveform to a user.

The display 455 controls all aspects of signal representation to a user, although not explicitly shown, may comprise any component that is required to receive data to be displayed and control a display device to display the data as required.

It is understood, that even if it is not shown, the oscilloscope 430 may also comprise a user interface for a user to interact with the oscilloscope 430. Such a user interface may comprise dedicated input elements like for example knobs and switches. At least in part the user interface may also be provided as a touch sensitive display device.

It is understood, that all elements of the oscilloscope 430 that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope 430 and not necessarily need to be partitioned into the different sections explained above.

The measurement signal inputs, as indicated above, in the oscilloscope may be implemented by or in the signal conditioning sections 432 of the vertical system 431. Of course, a respective connector may also be provided with the signal conditioning sections 432 to provide the measurement signal inputs. The analog-to-digital converters 436 may implement the multi-channel analog-to-digital converters.

Figure 5:
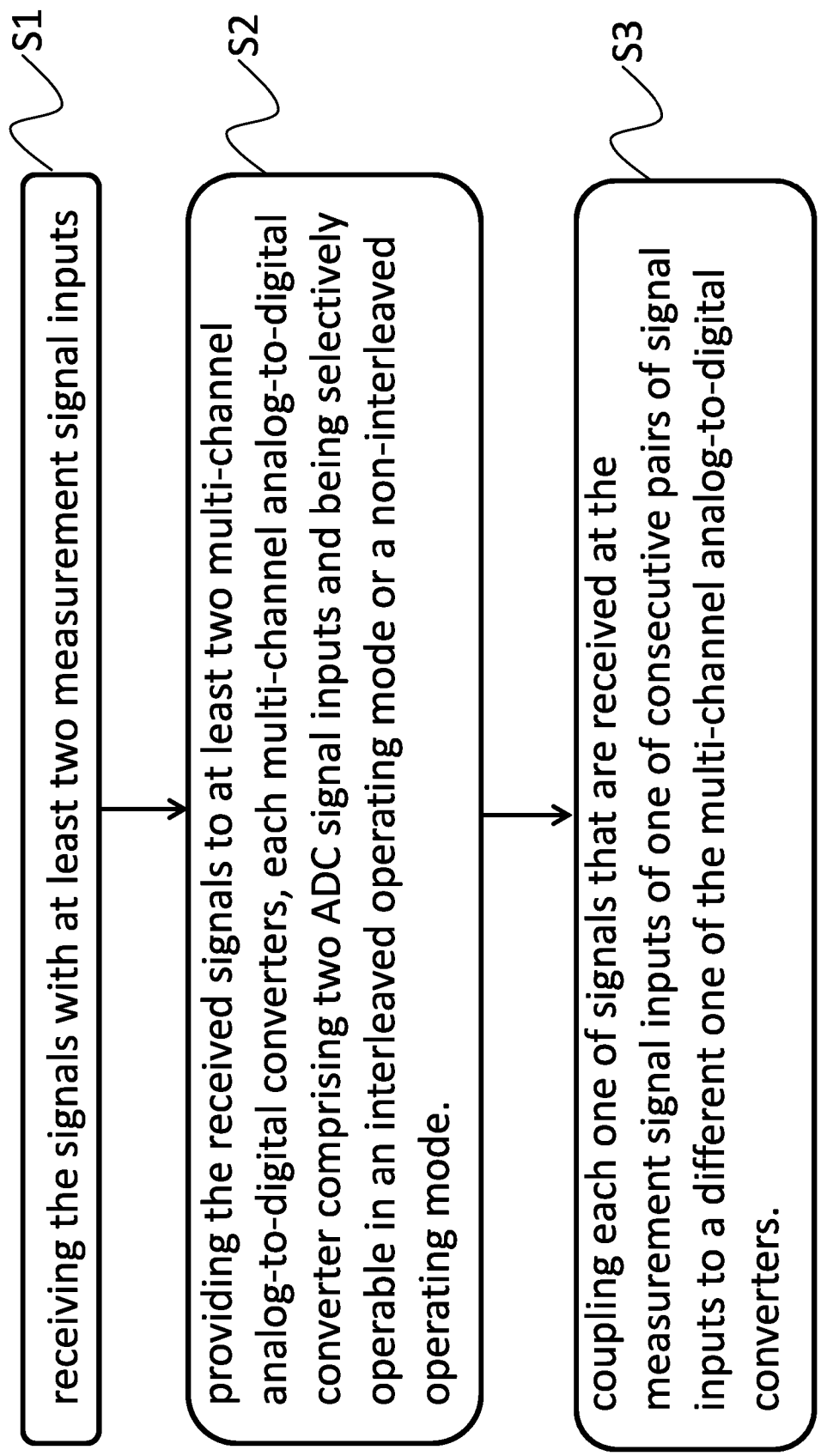
FIG. 5 shows a flow diagram of an embodiment of a method according to the present disclosure.

FIG. 5 shows a flow diagram of an embodiment of a method for measuring at least two signals.

The method comprises receiving S1 the signals with at least two measurement signal inputs. Further, the method comprises providing S2 the received signals to at least two multi-channel analog-to-digital converters, each multi-channel analog-to-digital converter comprising two ADC signal inputs and being selectively operable in an interleaved operating mode or a non-interleaved operating mode. In addition, the method comprises coupling or providing each one of signals that are received at the measurement signal inputs of one of consecutive pairs of signal inputs to a different one of the multi-channel analog-to-digital converters.

The signals received by the first measurement signal inputs and the second measurement signal inputs of consecutive pairs may both be provided to the first ADC signal inputs of different multi-channel analog-to-digital converters until all first ADC signal inputs of different multi-channel analog-to-digital converters are occupied.

In an example, up to four signals may be received with four measurement signal inputs forming two pairs of measurement signal inputs. The first measurement signal input of the first pair may be coupled to the first ADC signal input of the first multi-channel analog-to-digital converter, i.e., the first received signal is provided to this ADC signal input, and the second measurement signal input of the first pair may be coupled to the first ADC signal input of the second multi-channel analog-to-digital converter, i.e., the second received signal is provided to this ADC signal input. The first measurement signal input of the second pair may be coupled to the second ADC signal input of the first multi-channel analog-to-digital converter, i.e., the third received signal is provided to this ADC signal input, and the second measurement signal input of the second pair may be coupled to the second ADC signal input of the second multi-channel analog-to-digital converter, i.e., the fourth received signal is provided to this ADC signal input.

In another example, up to eight signals may be received with eight measurement signal inputs forming four pairs of measurement signal inputs, and the eight measurement signal inputs provide the up to eight signals to four multi-channel analog-to-digital converters.

The first measurement signal input of the first pair may be coupled to the first ADC signal input of the first multi-channel analog-to-digital converter, i.e., the first received signal is provided to this ADC signal input, and the second measurement signal input of the first pair may be coupled to the first ADC signal input of the second multi-channel analog-to-digital converter, i.e., the second received signal is provided to this ADC signal input. The first measurement signal input of the second pair may be coupled to the first ADC signal input of the third multi-channel analog-todigital converter, i.e., the third received signal is provided to this ADC signal input, and the second measurement signal input of the second pair may be coupled to the first ADC signal input of the fourth multi-channel analog-to-digital converter, i.e., the fourth received signal is provided to this ADC signal input. The first measurement signal input of the third pair may be coupled to the second ADC signal input of the first multi-channel analog-to-digital converter, i.e., the fifth received signal is provided to this ADC signal input, and the second measurement signal input of the third pair may be coupled to the second ADC signal input of the second multi-channel analog-to-digital converter, i.e., the sixth received signal is provided to this ADC signal input. The first measurement signal input of the fourth pair may be coupled to the second ADC signal input of the third multi-channel analog-to-digital converter, i.e., the seventh received signal is provided to this ADC signal input, and the second measurement signal input of the fourth pair may be coupled to the second ADC signal input of the fourth multi-channel analog-to-digital converter, i.e., the eighth received signal is provided to this ADC signal input.

The method may comprise indicating with a label for each one of the at least two measurement signal inputs a designation of the respective one of the at least two measurement signal inputs, wherein each one of the labels is different from the other labels.

The method may further comprise indicating which of the measurement signal inputs is coupled to one of the multi-channel analog-to-digital converters that only receives a signal on one of the ADC signal inputs.

In the interleaved operating mode the signals may be converted from analog to digital with two analog-to-digital converter elements in one of the multi-channel analog-to-digital converters that receives only one of the signals, and in the non-interleaved operating mode the signals may each be converted from analog to digital with one of the analog-to-digital converter elements in one of the multi-channel analog-to-digital converters that receives two of the signals.

In each one of the multi-channel analog-to-digital converters a multiplexer that is coupled on the input-side to the two ADC signal inputs and on the output-side to the two analog-to-digital converter elements of the respective multi-channel analog-to-digital converter may provide a single signal to both analog-to-digital converter elements or provide each one of two signals to one of the analog-to-digital converter elements.

Figure 6:
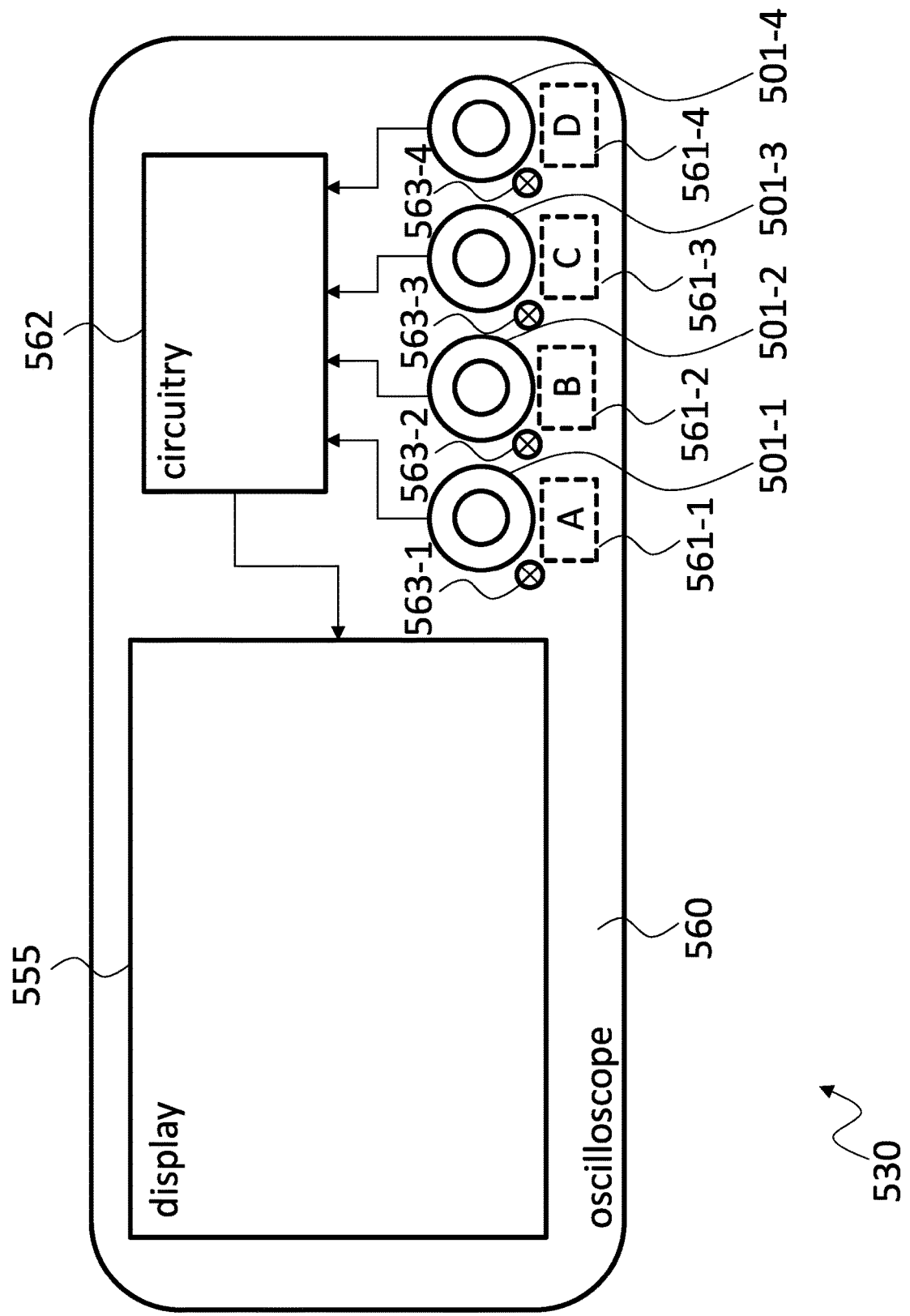
FIG. 6 shows a block diagram of another embodiment of an oscilloscope as a measurement device according to the present disclosure.

FIG. 6 shows a block diagram of another oscilloscope 530 that may be an implementation of a measurement device according to the present invention.

The oscilloscope 530 comprises a housing with a front plate 560. The front plate 560 accommodates a display 555 for displaying data to a user and further accommodates four measurement signal inputs 501-1, 501-2, 501-3, 501-4, here shown in the form of BNC-like connectors. The oscilloscope 530 further comprises an acquisition and control circuitry 562. This acquisition and control circuitry 562 may be any circuitry that is needed to acquire signals and process the signals in the oscilloscope 530. For example, the acquisition and control circuitry 562 may implement all or at least some of the elements of the oscilloscope 430 as shown in FIG. 4.

The front plate 560 further accommodates labels 561-1, 561-2, 561-3, 561-4 that each designate one of the measurement signal inputs 501-1, 501-2, 501-3, 501-4.

In the oscilloscope 530 the labels 561-1, 561-2, 561-3, 561-4 show letters "A", "B", "C", and "D". Of course the labels may comprise other indications, like numbers or combinations of numbers and letters.

The oscilloscope 530 on the front plate 560 further comprises indicators 563-1, 563-2, 563-3, 563-4. The indicators 563-1, 563-2, 563-3, 563-4 indicate which of the measurement signal inputs 501-1, 501-2, 501-3, 501-4 is coupled to one of the multi-channel analog-to-digital converters that only receives a single signal on only one of the ADC signal inputs. The indicators 563-1, 563-2, 563-3, 563-4 may for example be LEDs.

Figure 7:
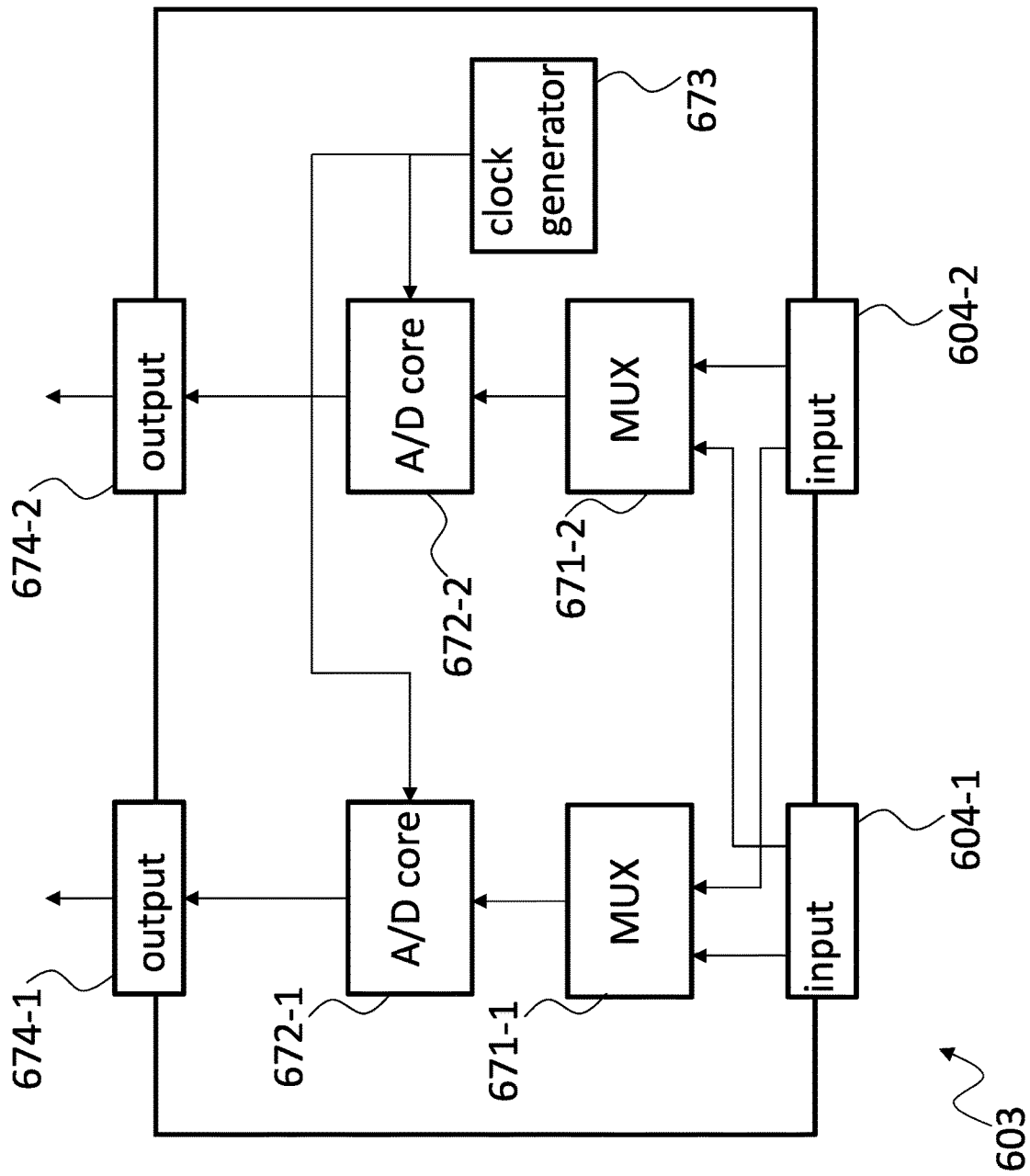
FIG. 7 shows a block diagram of an embodiment of a multi-channel analog-to-digital converter according to the present disclosure.

FIG. 7 shows a block diagram of a multi-channel analog-to-digital converter 603. The multi-channel analog-to-digital converter 603 comprises two ADC signal inputs 604-1, 604-2, which are each coupled to two multiplexers 671-1, 671-2. Each one of the multiplexers 671-1, 671-2 is coupled to the input side of one of two analog-to-digital converter elements 672-1, 672-2. A common clock generator 673 is also coupled to the two analog-to-digital converter elements 672-1, 672-2. The output side of each one of the analog-to-digital converter elements 672-1, 672-2 is coupled to a respective digital output 674-1, 674-2.

In the multi-channel analog-to-digital converter 603 the multiplexers 671-1, 671-2 serve to either couple every single one of the ADC signal inputs 604-1, 604-2 to one of the analog-to-digital converter elements 672-1, 672-2 in the non-interleaved operation mode or to couple only one of the ADC signal inputs 604-1, 604-2 to both analog-to-digital converter elements 672-1, 672-2 in the interleaved operation mode.

The common clock generator 673 supplies a clock signal to both analog-to-digital converter elements 672-1, 672-2 and therefore allows the analog-to-digital converter elements 672-1, 672-2 to perform the interleaved operation mode based on a common synchronization. The analog-to-digital converter elements 672-1, 672-2 or A/D cores may each comprise a standard analog-to-digital converter.

The multi-channel analog-to-digital converter 603 exemplarily comprises two digital outputs 674-1, 674-2. It is understood, that other implementations of the multi-channel analog-to-digital converter 603 may also comprise a single digital output. For example, a multiplexer may combine the signal streams on the output side of the analog-to-digital converter elements 672-1, 672-2 into a single digital data stream for a single digital output. Further, the multi-channel analog-to-digital converter 603 may comprise more than two ADC signal inputs 604-1, 604-2, like for example three or four ADC signal inputs.

Figure 8:
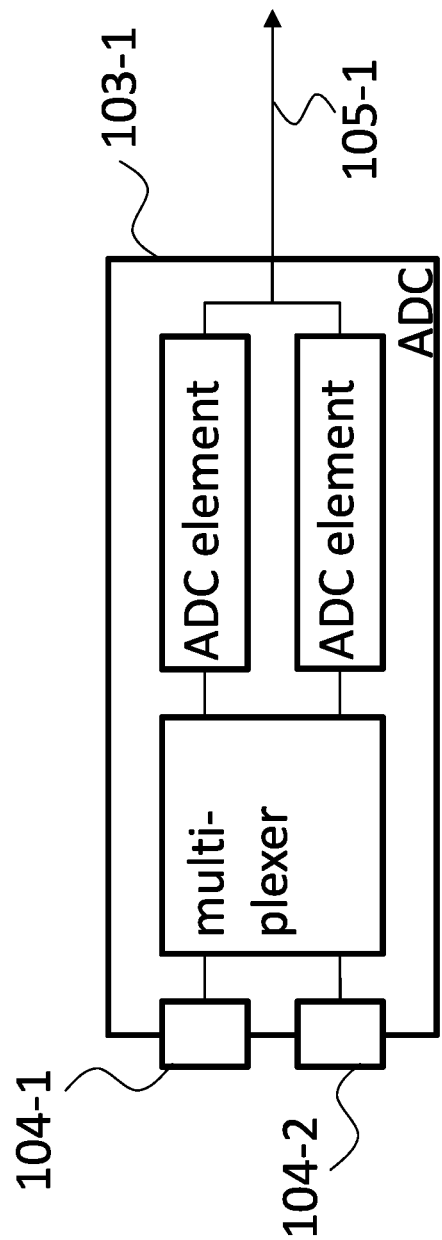
FIG. 8 shows a block diagram of an embodiment of an ADC of a measurement device according to the present disclosure.

FIG. 8 shows a block diagram of an embodiment of a multi-channel analog-to-digital converter 103-1 of a measurement device 100 according to the present disclosure. As shown, the multi-channel analog-to-digital converter 103-1 comprises two ADC signal inputs 104-1, 104-2. The multi-channel analog-to-digital converter 103-1 also comprises a multiplexer coupled on the input-side to the two ADC signal inputs 104-1, 104-2 and on the output-side to the two analog-to-digital converter elements. The output of the multi-channel analog-to-digital converter 103-1 is the digital signal 105-1.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS 100, 200 measurement device
101-1, 101-2 measurement signal input
201-1, 201-2, 201-3, 201-4 measurement signal input
301-1, 301-2, 301-3, 301-4 measurement signal input
301-5, 301-6, 301-7, 301-8 measurement signal input
501-1, 501-2, 501-3, 501-4 measurement signal input
102, 202-1, 202-2 pair
302-1, 302-2, 302-3, 302-4 pair
103-1, 103-2, 203-1, 203-2 multi-channel analog-to-digital converter
303-1, 303-2, 303-3, 303-4, 603 multi-channel analog-to-digital converter
104-1, 104-2, 104-3, 104-4 ADC signal input
204-1, 204-2, 204-3, 204-4 ADC signal input
304-1, 304-2, 304-3, 304-4 ADC signal input
304-5, 304-6, 304-7, 304-8 ADC signal input
604-1, 604-2 ADC signal input
105-1, 105-2, 205-1, 205-2 digital signal
305-1, 305-2, 305-3, 305-4 digital signal
430, 530 oscilloscope
431 vertical system
432 signal conditioning
433 attenuator
434 amplifier
435 filter
436 analog-to-digital converter
440 triggering section
441 amplifier
442 filter
443 trigger system
445 horizontal system
450 processing section
451 acquisition processing element
452 memory
453 post processing element
455, 555 display
560 front plate
561-1, 561-2, 561-3, 561-4 label
562 acquisition and control circuitry
563-1, 563-2, 563-3, 563-4 indicator
671-1, 671-2 multiplexer
672-1, 672-2 analog-to-digital converter element
673 clock generator
674-1, 674-2 digital output

What is claimed is:

1. A measurement device comprising:
at least two measurement signal inputs forming consecutive pairs of signal inputs;
at least two multi-channel analog-to-digital converters, each multi-channel analog-to-digital converter comprising two ADC signal inputs, each one of the two ADC signal inputs being configured for coupling the respective multi-channel analog-to-digital converter to one of the at least two measurement signal inputs and being selectively operable on a single signal received on one of the ADC signal inputs in a high-speed interleaved operating mode or on two signals received at the same time to the two ADC signal inputs in a lower-bandwidth non-interleaved operating mode;
wherein each one of the at least two measurement signal inputs of consecutive pairs of signal inputs is coupled to a different one of the multi-channel analog-to-digital converters, and
wherein, while in the high-speed interleaved operating mode, each multi-channel analog-to-digital converter is configured to switch from the high-speed interleaved operating mode into the lower-bandwidth non-interleaved operating mode responsive to receiving the two ADC signal inputs of the respective multi-channel analog-to-digital converter.

2. A measurement device according to claim 1, wherein the first measurement signal inputs and the second measurement signal inputs of consecutive pairs are both connected to the first ADC signal inputs of different multi-channel analog-to-digital converters until all first ADC signal inputs of different multi-channel analog-to-digital converters are occupied.

3. A measurement device according to claim 1, comprising four measurement signal inputs forming first and second pairs of measurement signal inputs;
wherein the first measurement signal input of the first pair is coupled to the first ADC signal input of the first multi-channel analog-to-digital converter, and wherein the second measurement signal input of the first pair is coupled to the first ADC signal input of the second multi-channel analog-to-digital converter; and
wherein the first measurement signal input of the second pair is coupled to the second ADC signal input of the first multi-channel analog-to-digital converter, and wherein the second measurement signal input of the second pair is coupled to the second ADC signal input of the second multi-channel analog-to-digital converter.

4. A measurement device according to claim 1, comprising eight measurement signal inputs forming first, second, third, and fourth pairs four pairs of measurement signal inputs, and comprising four multi-channel analog-to-digital converters;
wherein the first measurement signal input of the first pair is coupled to the first ADC signal input of the first multi-channel analog-to-digital converter, and wherein the second measurement signal input of the first pair is coupled to the first ADC signal input of the second multi-channel analog-to-digital converter;
wherein the first measurement signal input of the second pair is coupled to the first ADC signal input of the third multi-channel analog-to-digital converter, and wherein the second measurement signal input of the second pair is coupled to the first ADC signal input of the fourth multi-channel analog-to-digital converter;
wherein the first measurement signal input of the third pair is coupled to the second ADC signal input of the first multi-channel analog-to-digital converter, and wherein the second measurement signal input of the third pair is coupled to the second ADC signal input of the second multi-channel analog-to-digital converter; and
wherein the first measurement signal input of the fourth pair is coupled to the second ADC signal input of the third multi-channel analog-to-digital converter, and wherein the second measurement signal input of the fourth pair is coupled to the second ADC signal input of the fourth multi-channel analog-to-digital converter.

5. A measurement device according to claim 1, comprising a front plate that mechanically accommodates the at least two measurement signal inputs;

wherein the front plate comprises a label for each one of the at least two measurement signal inputs that designates a respective one of the at least two measurement signal inputs.

6. A measurement device according to claim 5, wherein the labels are different.

7. A measurement device according to claim 5, wherein the labels comprise a sequential indication.

8. A measurement device according to claim 1, wherein each one of the multi-channel analog-to-digital converters is provided as a dedicated converter element.

9. A measurement device according to claim 1, wherein each one of the multi-channel analog-to-digital converters comprises two analog-to-digital converter elements for acquiring respective analog signals and outputting digital output values corresponding to the respective analog signals.

10. A measurement device according to claim 9, wherein each one of the multi-channel analog-to-digital converters comprises a multiplexer coupled on an input-side to the two ADC signal inputs and on an output-side to the two analog-to-digital converter elements of the respective multi-channel analog-to-digital converter.

11. A measurement device according to claim 1, comprising an indicator that indicates which of the at least two measurement signal inputs are coupled to one of the multi-channel analog-to-digital converters that only receives a signal on one of the ADC signal inputs.

12. A measurement device according to claim 1, wherein the measurement device is an oscilloscope.

13. A method for measuring at least two signals, the method comprising:
receiving the signals with at least two measurement signal inputs forming consecutive pairs of signal inputs;
providing the received signals to at least two multi-channel analog-to-digital converters, each multi-channel analog-to-digital converter comprising two ADC signal inputs, each one of the two ADC signal inputs being configured for coupling the respective multi-channel analog-to-digital converter to one of the at least two measurement signal inputs and being selectively operable on a single signal received to one of the ADC signal inputs in a high-speed interleaved operating mode or on two signals received at the same time to the two ADC signal inputs in a lower-bandwidth non-interleaved operating mode;
wherein each one of signals that are received at the at least two measurement signal inputs of one of consecutive pairs of signal inputs is coupled to a different one of the multi-channel analog-to-digital converters, and
wherein, while in the high-speed interleaved operating mode, each multi-channel analog-to-digital converter is configured to switch from the high-speed interleaved operating mode into the lower-bandwidth non-interleaved operating mode responsive to receiving signals to both of the two ADC signal inputs of the respective multi-channel analog-to-digital converter.

14. A method according to claim 13, wherein the signals received by the first measurement signal inputs and the second measurement signal inputs of consecutive pairs are both provided to the first ADC signal inputs of different multi-channel analog-to-digital converters until all first ADC signal inputs of different multi-channel analog-to-digital converters are occupied.

15. A method according to claim 13, wherein up to four signals are received with four measurement signal inputs forming first and second pairs two pairs of measurement signal inputs;

wherein the first measurement signal input of the first pair is coupled to the first ADC signal input of the first multi-channel analog-to-digital converter, and wherein the second measurement signal input of the first pair is coupled to the first ADC signal input of the second multi-channel analog-to-digital converter; and
wherein the first measurement signal input of the second pair is coupled to the second ADC signal input of the first multi-channel analog-to-digital converter, and wherein the second measurement signal input of the second pair is coupled to the second ADC signal input of the second multi-channel analog-to-digital converter.

16. A method according to claim 13, wherein up to eight signals are received with eight measurement signal inputs forming first, second, third, and fourth pairs of measurement signal inputs, and the eight measurement signal inputs provide the up to eight signals to four multi-channel analog-to-digital converters;
wherein the first measurement signal input of the first pair is coupled to the first ADC signal input of the first multi-channel analog-to-digital converter, and wherein the second measurement signal input of the first pair is coupled to the first ADC signal input of the second multi-channel analog-to-digital converter;
wherein the first measurement signal input of the second pair is coupled to the first ADC signal input of the third multi-channel analog-to-digital converter, and wherein the second measurement signal input of the second pair is coupled to the first ADC signal input of the fourth multi-channel analog-to-digital converter;
wherein the first measurement signal input of the third pair is coupled to the second ADC signal input of the first multi-channel analog-to-digital converter, and wherein the second measurement signal input of the third pair is coupled to the second ADC signal input of the second multi-channel analog-to-digital converter; and
wherein the first measurement signal input of the fourth pair is coupled to the second ADC signal input of the third multi-channel analog-to-digital converter, and wherein the second measurement signal input of the fourth pair is coupled to the second ADC signal input of the fourth multi-channel analog-to-digital converter.

17. A method according to claim 13, comprising indicating with a label for each respective one of the at least two measurement signal inputs a designation of the respective one of the at least two measurement signal inputs, wherein each one of the labels is different from the other labels.

18. A method according to claim 13, wherein in the interleaved operating mode the signals are converted from analog to digital with two analog-to-digital converter elements for acquiring respective signals and outputting digital output value in one of the multi-channel analog-to-digital converters that receives only one of the signals, and wherein in the non-interleaved operating mode the signals are converted from analog to digital with one of the analog-to-digital converter elements in one of the multi-channel analog-to-digital converters that receives two of the signals.

19. A method according to claim 18, wherein each one of the multi-channel analog-to-digital converters comprises a multiplexer that is coupled on an input-side to the two ADC signal inputs and on an output-side to the two analog-to-digital converter elements of the respective multi-channel analog-to-digital converter and provides a single signal to both analog-to-digital converter elements or provides each one of two signals to one of the analog-to-digital converter elements.

20. A method according to claim 13, comprising indicating which of the at least two measurement signal inputs is coupled to one of the multi-channel analog-to-digital converters that only receives a signal on one of the ADC signal inputs.

21. Measurement device comprising:
at least two measurement signal inputs forming consecutive pairs of signal inputs;
at least two multi-channel analog-to-digital converters, each multi-channel analog-to-digital converter comprising two ADC signal inputs, each one of the two ADC signal inputs being configured for coupling the respective multi-channel analog-to-digital converter to one of the at least two measurement signal inputs and being selectively operable on a single signal received to one of the ADC signal inputs in a high-speed interleaved operating mode or on two signals received at the same time to the two ADC signal inputs in a lower-bandwidth non-interleaved operating mode;
wherein each one of the at least two measurement signal inputs of consecutive pairs of signal inputs is coupled to a different one of the multi-channel analog-to-digital converters;
wherein the measurement device comprises four measurement signal inputs forming first and second pairs of measurement signal inputs;
wherein the first measurement signal input of the first pair is coupled to the first ADC signal input of the first multi-channel analog-to-digital converter, and wherein the second measurement signal input of the first pair is coupled to the first ADC signal input of the second-|multi-channel analog-to-digital converter;
wherein the first measurement signal input of the second pair is coupled to the second ADC signal input of the first multi-channel analog-to-digital converter, and wherein the second measurement signal input of the second pair is coupled to the second ADC signal input of the second multi-channel analog-to-digital converter; and
wherein, while in the high-speed interleaved operating mode, each multi-channel analog-to-digital converter is configured to switch from the high-speed interleaved operating mode into the lower-bandwidth non-interleaved operating mode responsive to receiving the two ADC signal inputs of the respective multi-channel analog-to-digital converter.

* * * * *